(12) United States Patent
Vladimir

(10) Patent No.: US 6,340,874 B1
(45) Date of Patent: Jan. 22, 2002

(54) METHOD AND APPARATUS UTILIZED IN COMPUTER TYPE SYSTEMS FOR CONTROL OF VARIABLE SPEED FANS TO REDUCE THEIR NOISE

(75) Inventor: Knyazhitsky Vladimir, St.-Petersburg (RU)

(73) Assignee: Daystream Info INC, New York, NY (US)

( * ) Notice: Subject to any disclaimer, the term of this patent is extended or adjusted under 35 U.S.C. 154(b) by 0 days.

(21) Appl. No.: 09/583,039

(22) Filed: May 30, 2000

(51) Int. Cl.$^7$ ................................. F24F 7/00
(52) U.S. Cl. ................ 318/471; 318/461; 318/565; 318/812
(58) Field of Search ................ 318/565, 471, 318/461, 812

(56) References Cited

U.S. PATENT DOCUMENTS

| | | | | |
|---|---|---|---|---|
| 4,659,290 A | * | 4/1987 | Kundert | 417/32 |
| 4,722,669 A | * | 2/1988 | Kundert | 417/32 |
| 4,779,031 A | * | 10/1988 | Arends et al. | 318/565 |
| 5,845,045 A | * | 12/1998 | Jeske et al. | 388/804 |
| 6,040,668 A | * | 3/2000 | Huynt et al. | 318/471 |
| 6,188,189 B1 | * | 2/2001 | Blake | 318/474 |

* cited by examiner

Primary Examiner—Robert E. Nappi
Assistant Examiner—Rita Leykin

(57) ABSTRACT

Apparatus and method for reducing fan noise in a personal computer having at least one fan with a direct current motor. The fan is disposed within and ventilates a zone. Operative voltage is applied to the motor through a controller from a power supply. Thermo-sensors in the zone measure the temperature in the zone. A table coupled to the controller lists for each temperature value an optimum rotational rate for the fan, the optimal value being the minimal value of rotation rate for the fan to provide a sufficient ventilating of the zone at this corresponding temperature. The thermo-sensor when actual temperature in the zone is changed during operation, inputs this condition to the controller, which modifies the voltage, applied to the motor, to provide the assigned optimal rotation rate. The fan noise increases with increasing rotational rate, and thus minimizing the fan rotation rate for the current temperature in the ventilating zone reduces the noise generated by the fan, and reducing voltage supplied to the fan conserves energy.

6 Claims, 6 Drawing Sheets

METHOD AND APPARATUS UTILIZED IN COMPUTER TYPE SYSTEMS FOR CONTROL OF VARIABLE SPEED FANS TO REDUCE THEIR NOISE

FIELD OF THE INVENTION

The present invention relates to control of variable speed fans utilized in computer type systems.

BACKGROUND OF THE INVENTION

Fans are standard components in many commercial computers, workstations, notebook and desktop personal computer systems, and in many other electronic and mechanical systems. Fans remove heat generated due to operation of integrated circuits and other components in such systems.

The use of fans often presents certain disadvantages in various systems. For example, fan is a source of objectionable acoustic vibrations, the noise generated by the fan being a monotone non-decreasing function of the rotational rate of the motor. Also, fan often has a service life that is less than the service life of the equipment it protects, and generally a fan service life expectancy is the shorter the higher is operation rotation rate of the fan.

Additionally, fans require large operating currents, the current requirements increasing with the fan rotational rate. Such usage of large currents creates problems for low power, "green" personal computer systems.

The present invention employs simple and novel methods and apparatus for overcoming these disadvantages.

SUMMARY OF THE INVENTION

In accordance with the principles of this invention, the noise generated by at least one fan with a direct current motor, which is disposed within and ventilates a zone of a personal computer, is found to be a function of the rotational rate of the motor. In order to reduce the noise, it is necessary to reduce this rotational rate. To this end, a thermo-sensor is positioned within the zone adjacent the fan to measure the actual temperature thereof.

A controller is connected between the fan motor and a direct voltage power supply of the computer. The controller receives a first input from the sensor thereby reading the temperature in the zone and also receives an input voltage from the supply. The computer has a data file which contains for said fan a table which lists for each temperature an optimal rotational rate and also specifies a maximum allowable temperature value and recommended corresponding rotational rate value for said motor. When the actual temperature in the zone is changed during operation, the controller modifies the voltage fed to the motor in such manner as to provide the assigned optimal rotation rate.

In order to optimize the fan cooling efficiency at a given temperature, a tachometer can be integrated with the fan to measure the actual rotational rate thereof. The tachometer provides a second input to the controller thereby providing optimal reaction of the controller to variations in zone temperature.

The data file can also list first, second and third chosen modes of operation identifying respectively, suspension of normal computer operation, emergency deactuation of the computer, and generation of warning message to be received by the user. Each mode is initiated by a corresponding one of first, second and third specific listed commands when the current temperature exceeds the specified maximum. In the event that the actual temperature is not reduced below the maximum value, the controller actuates a selected one of first second and hird modes of operation in response-to a corresponding one of the first, second and third listed commands.

DETAILED DESCRIPTION OF PREFERRED EMBODIMENTS

Figure 1:
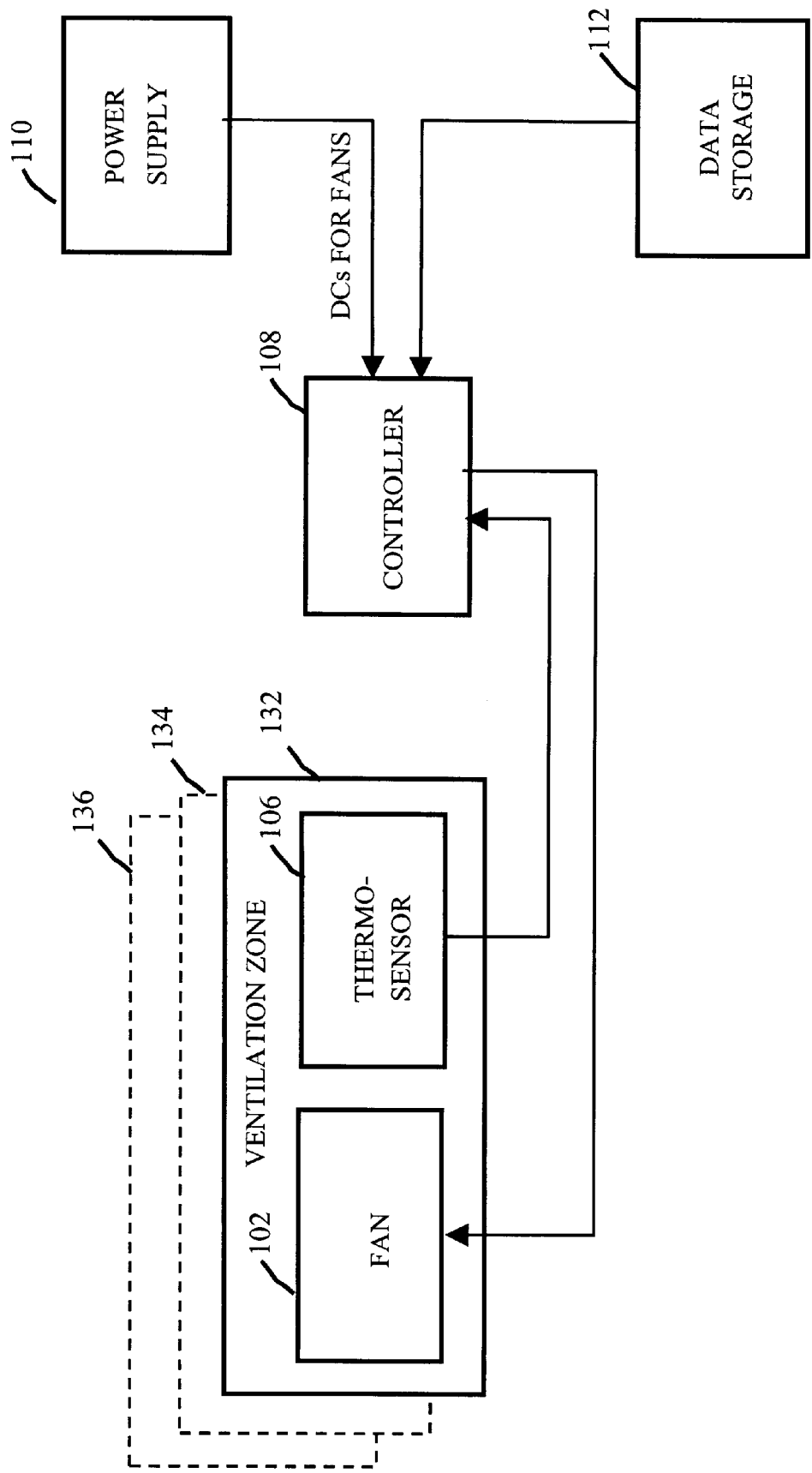
FIG. 1 shows a block diagram of system including a fan control method and apparatus in accordance with the invention applicable for fan without built-in tachometer.

Referring first to FIG. 1. In a PC (or another system) there are one or more zones 132, 134, 136 to be cooled (in a modern PC the zones usually are power supply unit and main processor, and, in some cases, the chassis). Each of the zones is ventilated by an individual fan powered by a direct current motor; e.g., fan 102 takes care of zone 132. Each of the zones is additionally supplied with an individual thermo-sensor (e.g., thermo-sensor 106 in zone 132) installed in the zone to measure its current temperature. The fans are power-supplied not directly from PC power supply unit 110, but via controller 108, which is able to modify the voltage supplied to each of the fans independently. During operation, controller 108 receives input signals from each of the thermo-sensors thereby reading the temperature in each of the zones. The actual temperature is compared with a discrete temperature values from a table stored in data storage 112 and accessed by the controller. The table lists for each corresponding zone temperature value a minimal rotational rate for providing the necessary ventilation of the corresponding zone at this temperature value and also specifies a maximum allowable temperature value and recommended corresponding rotational rate value for each of the motors. The controller when the actual temperature in any one of the zones is changed during operation, modifies the voltage supplied to this motor in such manner as to provide the assigned optimal rotation rate.

Figure 2:
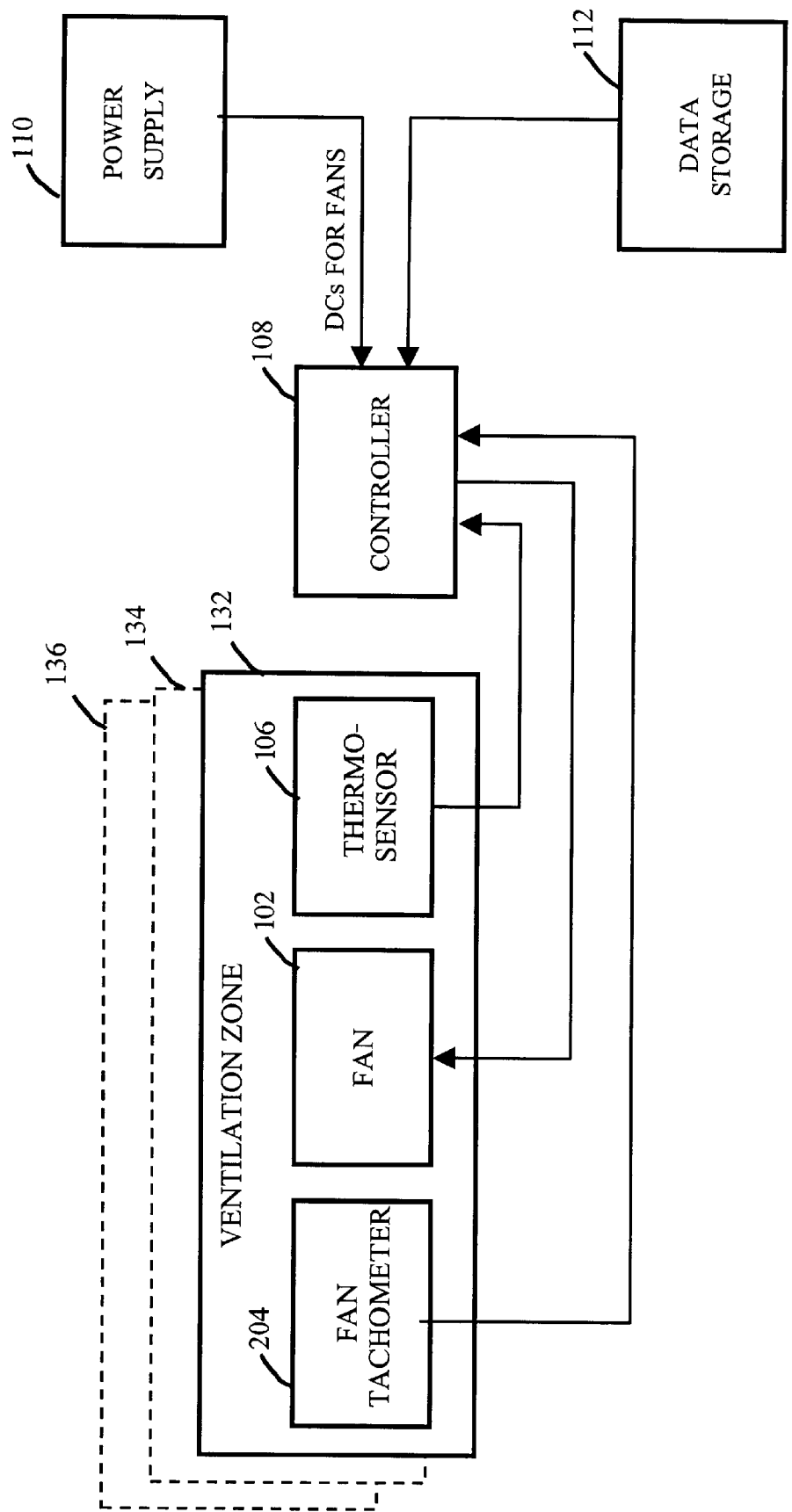
FIG. 2 shows a block diagram of system including a fan control method and apparatus in accordance with the invention applicable for fan provided with built-in tachometer.

FIG. 2 shows a block diagram of system including a fan control method and apparatus in accordance with the invention applicable for fan provided with built-in tachometer. In contrast to block diagram shown in FIG. 1, in this case each of fans in ventilated zones 132, 134, and 138 is equipped with a built-in tachometer (e.g., tachometer 204 is adjusted to fan 102, ventilating zone 132). Controller 108 receives additional, as compared with the case of FIG. 1, signals from the tachometers thereby reading the actual rotation rate of each of the fan motors. Data storage 112 in this case contains, for each of the zones, a table with a series of temperature values for corresponding zone and corresponding optimal rotation rates of the fan in the zone. In operation, controller compares current temperature reading for each of the zones with discrete temperature values in the table, and modifies the voltage supplied to the fan motor in such a way as to make the fan rotation rate reading provided by the fan tachometer to be equal to the rotation rate value, which corresponds to the nearest temperature value superior to the actual measured temperature in the zone.

Figure 3:
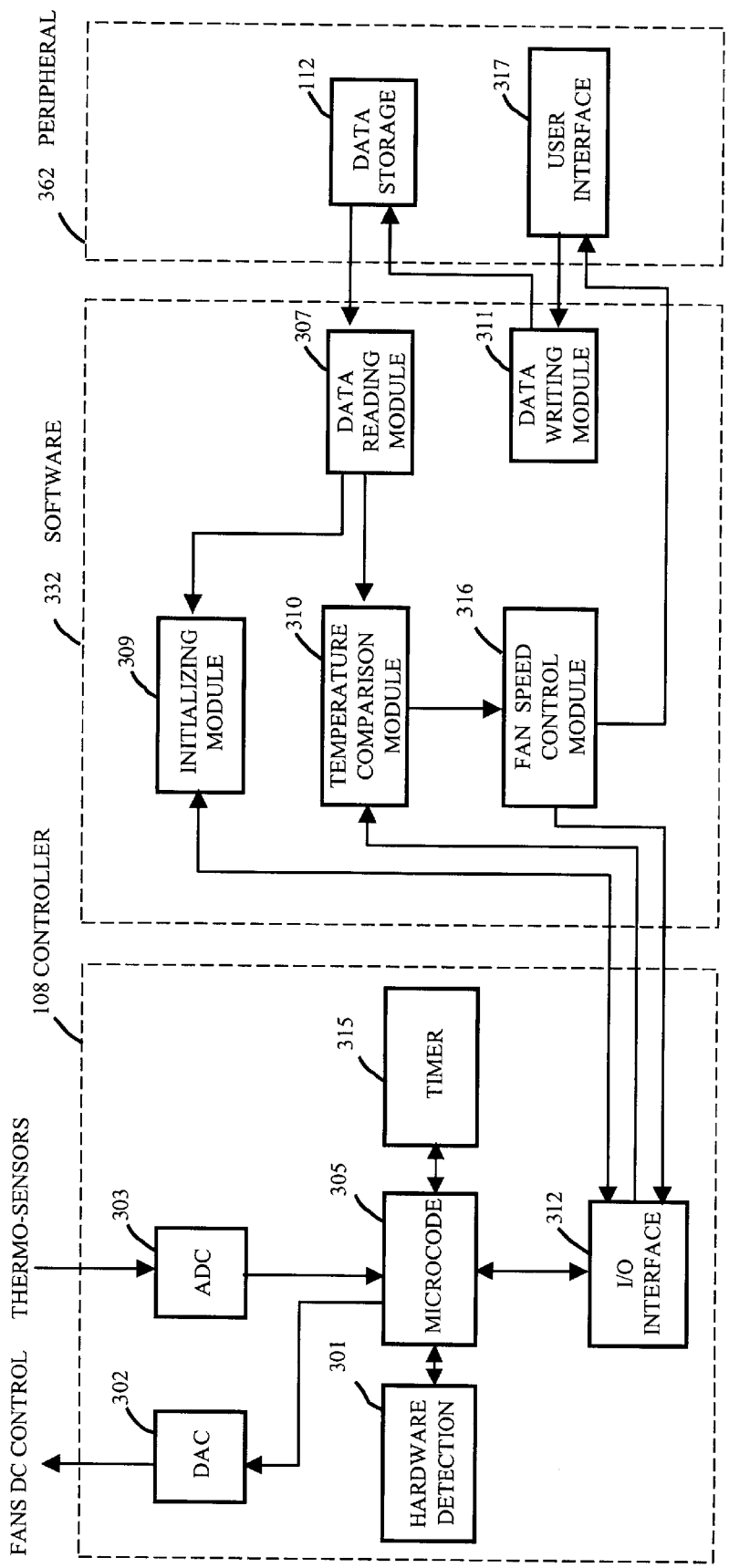
FIG. 3 shows a circuit diagram of a fan power controller in accordance with the invention applicable for fan without built-in tachometer.

FIG. 3 shows a circuit diagram of fan controller and adjacent software applicable for use without a tachometer.

Controller 108 contains micro code 305, which ensures interaction of elements of the apparatus. Input/output interface with system bus 312 provides signal exchange between the controller and software component 332 (e.g., via 12C interface). After the system is started up, initializing module 309 generates signal that actuate hardware detection block 301, which enables system to adapt itself for current PC configuration with the allowance made for actually installed or removed fans and thermo-sensors. Signal from module 309 also initializes the fans acceleration with short-run energizing the fan motors by 100% nominal voltage (the acceleration regime is necessary for the fans to be set to motion, because initially supplied low voltage may fail to start the motors).

Readings from the thermo-sensors installed in ventilated zones of the PC come to signal processing block 303 (analog-to-digit converter). The results are compared in block 310 with temperature values from table stored in data storage 112, the data being read with the help of reading module 307.

The control over fan rotation rates is performed by fan speed control module 316. Signals from the module are transferred to controller 108 via interface 312. In accordance with the signals, block 302 (digit-to-analog converter) generates corresponding DC voltages supplied to the fans. When voltage supplied to a fan is altered to be brought into agreement with tabulated voltage value for current temperature in the corresponding zone, timer 315 sets a time delay (a pause) which is necessary for the fan rotation rate to stabilize at a new level.

The system is provided with user's interface 317, which displays current values of temperatures in ventilated zones of the PC and rotation rates of corresponding fans. The interface may be also used to alternate the content of data storage 112 (that is, the tables of temperature values and corresponding fan supply voltages for each of the ventilated zones); the data are written to the file with the help of data writing module 311.

Figure 4:
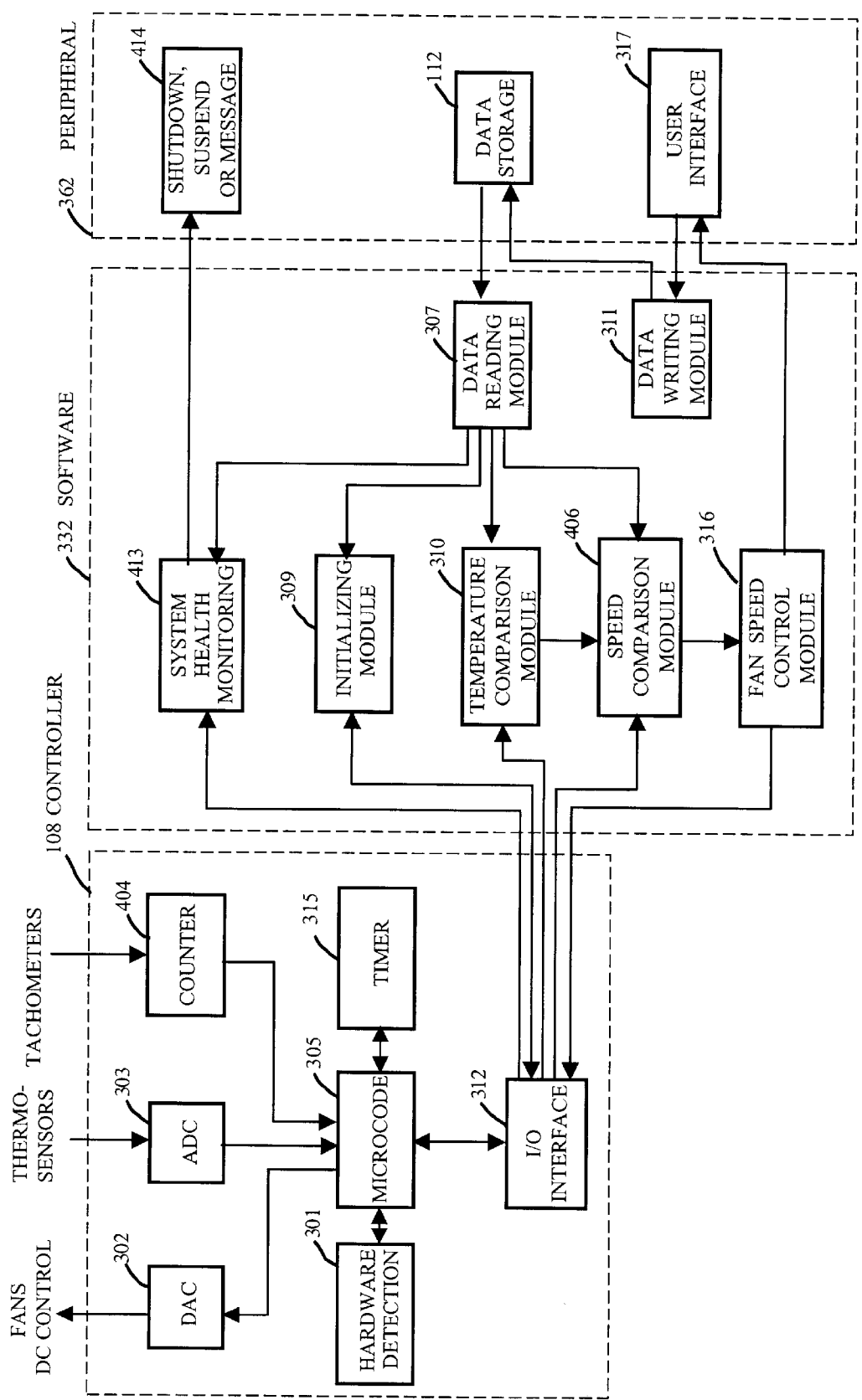
FIG. 4 shows a circuit diagram of a fan power controller in accordance with the invention applicable for fan provided with built-in tachometer.

FIG. 4 shows a circuit diagram of fan controller and adjacent software in accordance with the invention applicable for fans provided with built-in tachometer.

This system is designed to operate with ventilating fans provided with built-in tachometers. The availability of the tachometers (as well as fans and thermo sensors) is checked by hardware detection block 301, which enables system to adapt itself for current PC configuration. Controller 108 receives additional, as compared with the case of the system shown in FIG. 3, signals from the tachometers thereby reading the actual rotation rate of each of the fan motors. The signals arrive to micro code 305 via block of accumulating counters 404 (analog-to-digit converters).

Data storage 112 in this case contains, for each of the zones, a table with a series of temperature values for the zone and corresponding optimal rotation rates of the fan ventilating the zone. In operation, block 310 compares current temperature reading for each of the zones with discrete temperature values in the table, and fan speed control module 316 modifies the voltage supplied to the fan motor in such a way as to make the fan rotation rate reading provided by the fan tachometer to be equal to the rotation rate value, which corresponds to the nearest temperature value superior to the actual measured temperature in the zone. Fan speed comparison module 406 exerts control over the voltage modulation by checking the current rotation rate of the fan motor against the value read from the corresponding table in data storage 112 with the help of data reading module 307.

The systems features may be expanded to include protection of PC components against accidental overheating. Additional system health monitoring module 413 constantly compares, for each of the PC zones, current temperature reading, derived from controller 108 via interface 312, with maximal allowable temperature for the zone read from data storage 112 with the help of data reading module 307. When the current temperature in a zone exceeds the specified maximum, system health monitoring module 413 passes control to PC control signals generation block 414. In accordance with preset mode of system operation in case of the PC component (zone) overheating, block 414 generates a warning message to be received by the user via user's interface 312, or issues a command to emergency deactivate the PC or to suspend its normal operation. Mode of system operation is specified in data file stored in module 112, the mode may be chosen by PC user and written to the file with the help of user's interface 312 and data writing module 311.

Figure 5:
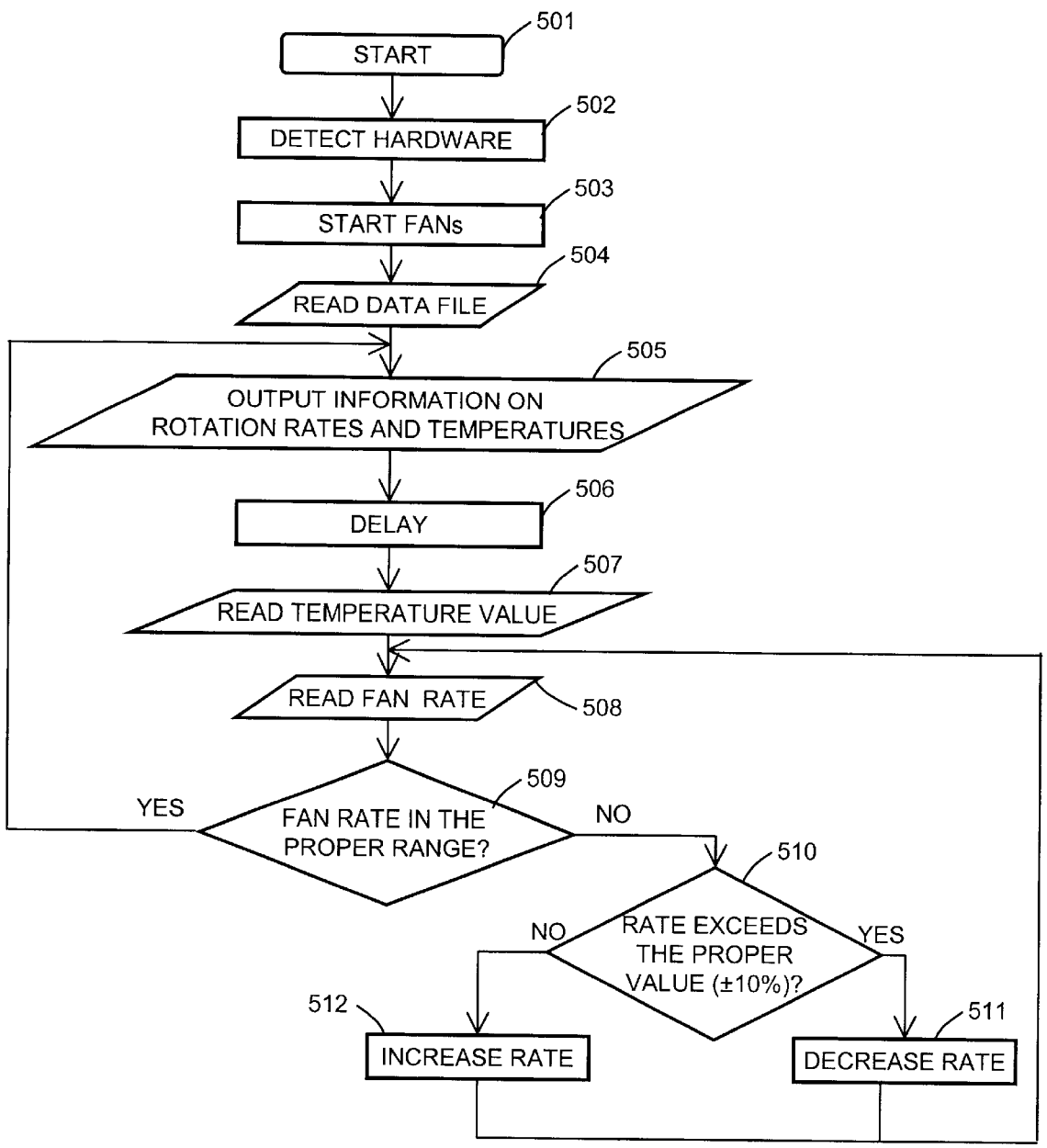
FIG. 5 shows a flowchart of fan power control in accordance with the invention.

FIG. 5 shows a flowchart of fan power control in accordance with the invention. When the program is started up, it is loaded to the PC operation memory and initialized (block 501). After initialization, the program checks actual configuration of the cooling system (availability of thermo-sensors and fans, and the presence of build-in tachometers); the procedure is realized by block 502. When the checking procedure is completed, fans motors starting-up routine is executed, the starting pulse being delivered to the fans by block 503.

The next step is reading operation information from data storage; the function is being conducted by block 504. The information to be read includes, for each of ventilated zones, a table of discreet temperature values and corresponding optimal fan rotation rates. An example of such a table (for a PC power supply unit) is presented below in Table 1:

TABLE 1

Initial table of "temperature-rate" dependence for one of ventilated zones (a PC power supply unit)

| Temperature, C.° | Fan rotation rate, rpm |
| --- | --- |
| 24 | 0 |
| 25 | 800 |
| 35 | 1200 |
| 40 | 2400 |
| 50 | 4000 (max) |

In addition to a —"temperature—rate" table, the operation information include maximal allowable temperature value for the zone, and modes of system operation in case of the PC component (zone) overheating.

the system operation can be watched by operator with the help of user's interface, which is data-supplied from block 505. The block is the first in the main operation cycle of the program, which incorporates also blocks 506–512.

Block 506 sets the necessary time interval between separate readings of current data and provides a time delay to ensure fan rotation rate stabilization after a change is made in voltage supplied to the fan. Block 507 reads discreet temperature values from data file, and 509 compares actual temperature readings fed by thermo-sensor with the tabulated values. It is just the block, which perfumes the function of fan rotation rate control.

In case of stable operation regime, when actual temperature inside the zone remains in the same interval between tabulated temperature values and the fan rotation rate is equal to the corresponding (tabulated) optimal value (±10%), the algorithm is being closed by block 505. Otherwise, if the actual temperature reading is found to exceed the upper value of the initial temperature interval, (or to drop below the lower value of the interval), the fan rotation rate should be increased (decreased) to be brought to agreement with a new optimal (tabulated value). The decision on necessary modulation (increase or decrease) of rotation rate and, therefore, fan-supplied voltage is derived by block 510, and than control transition to block 511 or block 512, correspondingly. After a modification is done, control returns to block 508; it makes it possible to determine, if the carried out modification of voltage supplied to the fan is sufficient for optimization the fan rotation rate. An example of the fan speed control system operation is demonstrated by graphs shown in FIG. 6, A, and B. The graphs corresponds to the case of PC power supply unit ventilation, the initial "temperature—rate" table being presented in Table 1.

Figure 6A:
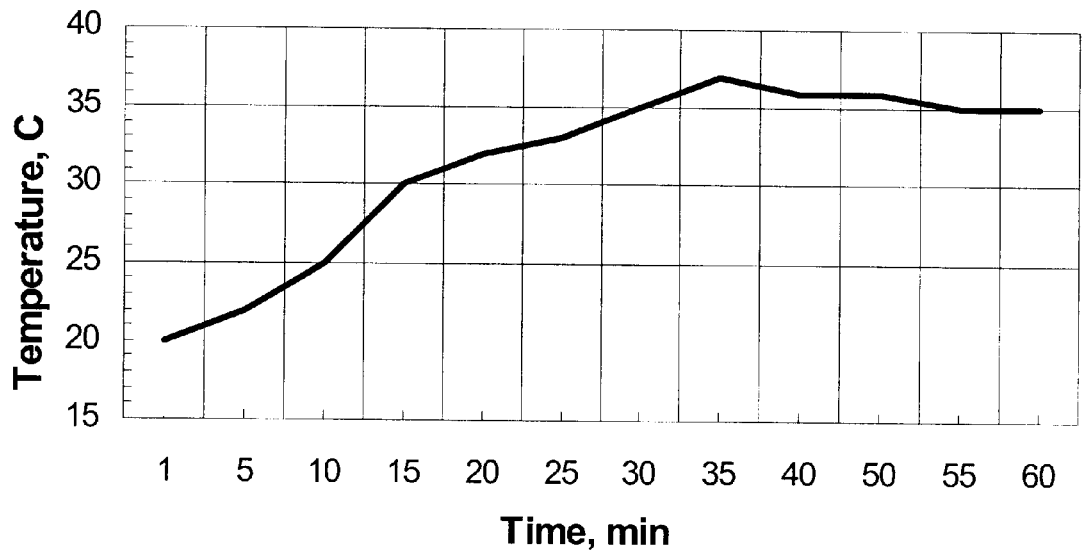
FIG. 6 A and B, show graphs of fan speed control during continuous mode operation in accordance with the invention.
Figure 6B:
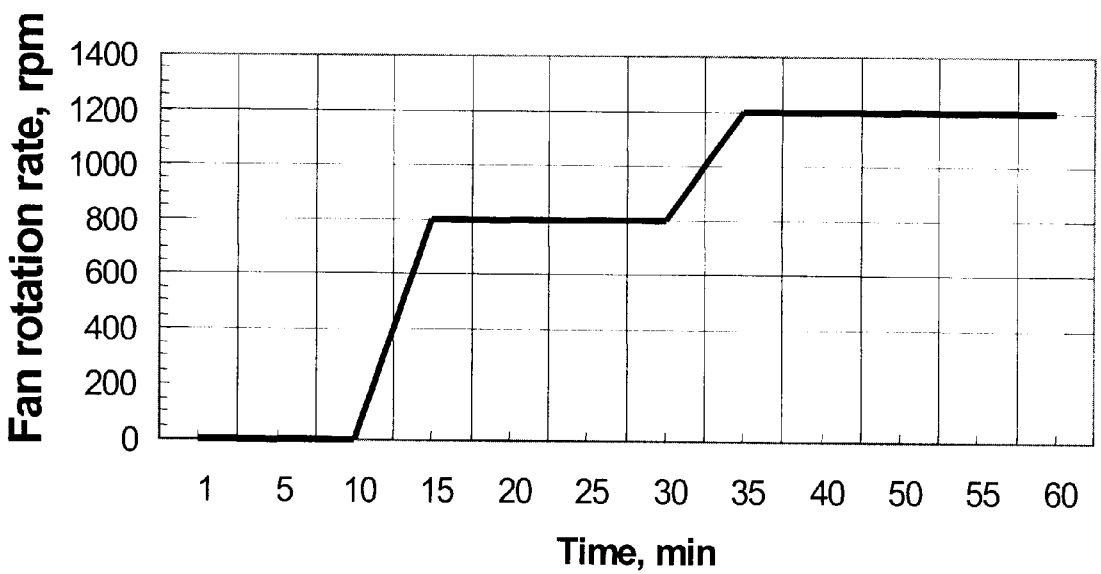

The starting moment for the diagrams corresponds to the moment when fan starting up routine is completed (about a minute after the system operation begins). The initial temperature inside the zone (PC power supply unit) is below 25° C., as is seen in FIG. 6A, so the zone does not needs ventilation (fan rotation rate is zero during the period, see FIG. 6B). In 10 min the zone is warmed up (the temperature exceeds 25° C. in FIG. 6A), and the fan is started; its rotation rate is being increased for about 5 min, as seen in FIG. 6B, to become equal to the optimal value of 800 rpm for the temperature regime (in accordance with Table 1).

The temperature of the zone continues to increase and exceeds the next tabulated value of 35° C. (see Table 1) by the moment T=30 min in FIG. 6A. As a response, the algorithm brings the fan rotation rate to the new optimal value of 1200 rpm, specified by Table 1, as seen in FIG. 6B. In 5 minutes increasing in the zone temperature is terminated (the delay determined by thermal capacity of elements of the PC power supply unit), the temperature decreases and comes to the level of 35° C. (FIG. 6A).

While the invention has been described with particular reference to the drawings and detailed description, the protection solicited is to be limited only by the terms of the claims which follow.

What is claimed is:

1. Apparatus for reducing fan noise in a personal computer having at least one fan with a direct current motor which is disposed within and ventilates a zone, the noise generated by the fan being a monotone non-decreasing function of the rotational rate of the fan whereby minimizing the rotation rate of the motor for the current temperature in the ventilating zone minimizes the fan noise at that temperature, said apparatus comprising:

a thermo-sensor positioned within the zone adjacent the fan and producing a first voltage which is a measurement of the actual temperature;

a direct voltage power supply;

a digital data storage file device which contains for said fan a table listing for each of a range of discrete temperature values an associated minimum voltage which when supplied to the fan motor will minimize the rotation rate accordingly; and a controller connected between the fan motor and the power supply to modify the output voltage from the supply and to supply the modified voltage to the motor, the controller receiving as a first input said first voltage to read the actual temperature voltage value in the zone, said controller receiving as a second input the voltage data from said device in order to compare the actual zone temperature voltage value with the range of temperature voltage values in the file to select the nearest superior discrete temperature voltage value, the minimum voltage associated with said superior discrete voltage value being supplied by the controller to the motor to minimize the fan noise accordingly.

2. Apparatus as set forth in claim 1 further including a tachometer positioned within the zone for measuring the rotational rate of the motor in the form of a third voltage, said controller receiving said third voltage for use in checking the actual rotational rate of the motor.

3. Apparatus for reducing fan noise in a personal computer having a first zone containing a chassis and a chassis fan for ventilating the first zone, a second zone containing a main processor and a processor fan ventilating the second zone, and a third zone containing a power supply with a power supply fan ventilating the third zone, all fans having direct motors, the noise generated by each fan being a monotone non-decreasing function of the rotational rate of its motor whereby minimizing the rotation rate of each motor for the current temperature in the corresponding zone minimizes the fan noise in that zone at that current temperature, said apparatus comprising:

first, second and third thermo-sensors, each sensor being positioned within a corresponding one of the three zones adjacent the corresponding fan therein and producing a first voltage which is a measurement of the actual temperature in the corresponding zone;

a direct voltage power supply;

a digital data storage file device which contains for each fan a corresponding one of first, second and third separate tables listing for said each fan for each of a range of discrete temperature voltage values a corresponding associated one of minimum voltages which when supplied to the motor of said each fan will minimize the rotation rate accordingly; and a controller connected between the motors of all fans and the power supply to modify separately for each motor the output voltage from the supply and to supply each separately modified voltage to the corresponding motor, the controller receiving said first voltages from the thermo-sensors to read the actual temperature voltage values in each of the zones, said controller receiving as second inputs the voltage data from each of the data files from said device in order to compare for each zone the actual temperature voltage values with the range of temperature voltage values in the corresponding table to select the nearest superior discrete temperature voltage values, the minimum voltages associated with said superior discrete voltage values being supplied by the controller to the corresponding motors to minimize its fan noise accordingly.

4. Apparatus as set forth in claim 1 wherein the table in said device in addition specifies a maximum allowable temperature value and includes first, second and third means for changing the operation of the computer when the current temperature exceeds said maximum, the first means suspending normal computer operation, the second means deactuating the computer, the third means issuing an alarm to the user of the computer.

5. A method for reducing fan noise in a personal computer having at least one fan with a direct current motor which is disposed within and ventilates a zone, the noise generated by the fan being a monotone non-decreasing function of the rotational rate of the fan whereby minimizing the rotation rate of the motor for the current temperature in the ventilating zone minimizes the fan noise at that temperature, said method utilizing a digital storage file device which contains for said fan a table listing for each of a range of discrete temperature values an associated minimum voltage which when supplied to the fan motor will minimize the rotational rate accordingly, said method comprising the steps of:

positioning a thermo-sensor in said zone adjacent the fan to produce a first voltage which is a measurement of the actual temperature;

connecting a controller between the fan motor and a power supply to modify the output voltage from said supply and to apply said modified voltage to the motor, the controller receiving as a first input said first voltage to read the actual temperature in the zone, the controller receiving as a second input the voltage data from said device to compare the actual zone temperature voltage with the range of voltage values in the file to select the nearest superior discrete temperature voltage value, and supply the minimum voltage associated with said superior discrete voltage value to the motor to minimize the fan noise accordingly.

6. A method for reducing fan noise in a personal computer having at least one fan with a direct current motor and a tachometer secured thereto, the tachometer measuring the rotational rate of the motor in the form of a first voltage, said fan being disposed within and ventilating a zone, the noise generated by the fan being a monotone non-decreasing function of the rotational rate of the fan whereby minimizing the rotation rate of the motor for the current temperature in the ventilating zone minimizes the fan noise at that temperature, said method utilizing a digital storage file device which contains for said fan a table listing for each of a range of discrete temperature values an associated second voltage corresponding to a minimal rotational rate accordingly, said method comprising the steps of:

positioning a thermo-sensor in said zone adjacent the fan to produce a third voltage which is a measurement of the actual temperature; and connecting a controller between the fan motor and a power supply to modify the output voltage from said supply through use of said first, second and third voltages, and to supply said modified voltage to the motor to minimize the fan noise in accordance with said table.

\* \* \* \* \*